United States Patent
Schwertfeger et al.

(10) Patent No.: US 6,946,030 B2
(45) Date of Patent: Sep. 20, 2005

(54) METHOD FOR THE PRODUCTION OF A SILICA GLASS CRUCIBLE WITH CRYSTALLINE REGIONS FROM A POROUS SILICA GLASS GREEN BODY

(75) Inventors: Fritz Schwertfeger, Muehldorf (DE); Holger Szillat, Emmerting (DE); Christoph Frey, Burghausen (DE); Ulrich Lambert, Emmerting (DE); Axel Frauenknecht, Burghausen (DE)

(73) Assignee: Wacker-Chemie GmbH, Munich (DE)

( * ) Notice: Subject to any disclaimer, the term of this patent is extended or adjusted under 35 U.S.C. 154(b) by 156 days.

(21) Appl. No.: 10/292,059

(22) Filed: Nov. 12, 2002

(65) Prior Publication Data

US 2003/0159648 A1 Aug. 28, 2003

(30) Foreign Application Priority Data

Nov. 15, 2001 (DE) .......................................... 101 56 137

(51) Int. Cl.[7] ............................................. C30B 15/10
(52) U.S. Cl. ........................... 117/200; 117/213; 65/33; 65/30.1; 65/DIG. 8; 502/54
(58) Field of Search ................................ 117/200, 213; 65/33, 30.1, DIG. 8; 502/54

(56) References Cited

U.S. PATENT DOCUMENTS 4,018,615 A  4/1977 Mills
5,053,359 A  10/1991 Loxley et al.
5,976,247 A  * 11/1999 Hansen et al. ............... 117/200
6,319,313 B1 * 11/2001 Phillips et al. ................ 117/13
6,641,663 B2 * 11/2003 Kemmochi et al. .......... 117/200

FOREIGN PATENT DOCUMENTS

| DE | 33 02 745 A1 | 8/1984 |
| DE | 199 43 163 A1 | 3/2001 |
| EP | 0 753 605 B1 | 8/2000 |
| GB | 1 438 788 | 3/1976 |

OTHER PUBLICATIONS

English Derwent Abstract Corresponding to DE 199 43 103 AN 2001–329827 [35].
English Derwent Abstract Corresponding to DE 33 02 745 AN 1984–195987 [32].

* cited by examiner

Primary Examiner—Robert Kunemund
(74) Attorney, Agent, or Firm—Brooks Kushman P.C.

(57) ABSTRACT

A silica glass crucible is produced by
a) providing a porous amorphous silica glass green body, which is infiltrated with at least one substance that promotes crystallization of a silica glass crucible,
b) drying the infiltrated silica glass green body,
c) filling the green body with a metal or semimetal, and
d) heating the filled green body for a period of from 1 h to 1000 h to a temperature of from 900 to 2000° C. to form at least a portion of silica crystalline phase.

The process may be continued by further heating to melt the metal or semimetal and pulling a single crystal from the melt.

20 Claims, 3 Drawing Sheets

METHOD FOR THE PRODUCTION OF A SILICA GLASS CRUCIBLE WITH CRYSTALLINE REGIONS FROM A POROUS SILICA GLASS GREEN BODY

BACKGROUND OF THE INVENTION

1. Field of the Invention

The invention relates to a method for the production of a silica glass crucible with crystalline regions from a porous silica glass green body, and to the use of the method for pulling Si single crystals according to the Czochralski method ("CZ method").

2. Background Art

During the production of Si single crystals by means of CZ methods, the quality of the quartz glass crucible that is used plays a decisive role in relation to the properties of the crystal to be produced, and in the relation to the maximum achievable yield of monocrystalline material. In the standard pulling process, quartz glass crucibles are used which are melted from crystalline $SiO_2$ particles (for example quartz sand) in a melting process, generally in an arc discharge. In this case, a closed, amorphous, vitrified inner layer and a fully vitrified outer body with low porosity are formed. It is desirable that the inner layer contain the fewest possible amount of bubbles, and when present, in the smallest possible size. Impurities in the inner surface of the crucible, introduced during the production process or which diffuse into the crucible surface from the starting material during crystal production by the subsequent CZ method, lead to corrosion of the inner surface during crystal production. Corrosion, in the case of amorphous quartz glass crucibles, is a limiting factor for crucible life within which it is possible to produce monocrystalline material.

These corrosion phenomena are avoided by applying materials that cause near-surface crystallization of the amorphous vitrified layer during the CZ method. One such method is described, for example, in European patent EP 0 753 605 B1, which further indicates that the mechanical stability of the quartz glass crucible can be increased if crystallization of the outside of the crucible is also induced. The disadvantage of the methods described in EP O 753 605 B1 is that the chemicals which induce crystallization are applied to the amorphously vitrified inner surface of a crucible or, in the case of coating the outside of the crucible, to a vitrified body with low porosity. The crystalline quartz layer then created in the CZ method reaches only a thickness of less than 1 mm when coating the inside of the crucible, and less than 2 mm when coating the outside of the crucible. This means that the increase in stability of the crucible when coating the outside of the crucible is unduly limited.

When coating the inside of the crucible, the very thin crystalline layer that is formed in the CZ method leads to mechanical stresses between the crystalline and amorphous regions of the quartz glass crucible. These are due to the differing thermal expansion coefficients and the differing mechanical stabilities of the amorphous and crystalline modifications of the crucible material as a function of temperature. As a result of these stresses, quartz particles may be displaced from the inner surface of the crucible and, via the Si melt, reach the growing crystal where they induce undesired dislocations. Furthermore, under the thin crystalline layer of the inner surface of the crucible, the bubbles present in the amorphous starting material can grow at an unreduced rate during the CZ method and, when displaced, likewise contribute to the emission of quartz glass particles into the Si melt.

It is not possible to increase the thickness of the crystalline layer by introducing substances into the material being processed which promote subsequent crystallization of the amorphous quartz crucible by means of known melting methods to form a quartz glass crucible, since the crucible begins to crystallize during production (when melting). Upon cooling, cracks are formed which make the crucible unusable, for example due to the β to α cristobalite transformation known in the literature.

SUMMARY OF THE INVENTION

It was therefore an object of the present invention to provide a method for the production of a silica glass crucible, which provides to a crucible that does not have the previously described disadvantages, when pulling single crystals, preferably Si single crystals, by means of the CZ method.

DETAILED DESCRIPTION OF THE PREFERRED EMBODIMENT(S)

Figure 1:
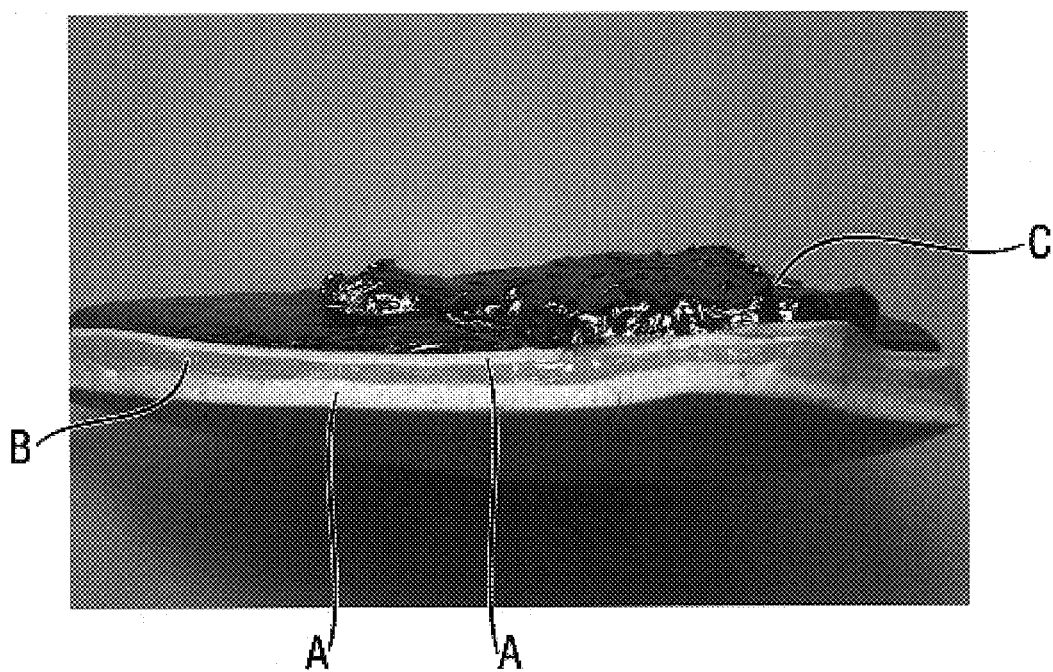
FIG. 1 shows a photographic image of a cross section of a silica glass crucible, which was formed by using the method according to Example 2. The cristobalite layers A, which include a core of amorphous quartz glass B, can be seen clearly here together with a silicon layer C in the interior of the crucible.

Thus, the present invention pertains to a method wherein a) a porous amorphous silica glass green body, which is infiltrated with at least one substance that promotes crystallization of a silica glass crucible, is produced, b) the infiltrated silica glass green body is dried, c) filled with a metal or semimetal and d) heated for a period of from 1 h to 1000 h to a temperature of from 900 to 2000° C.

In the method according to the invention, a crystalline phase, preferably cristobalite, is formed in situ in the silica glass crucible during or after the melting of the metal or semimetal. During simultaneous pulling of a single crystal from the metal or semimetal melted in the crucible, for example an Si single crystal according to the CZ method, the disadvantages known from the prior art do not arise.

In the context of the present invention, a silica glass green body is intended to mean a porous amorphous shaped body with a crucible shape produced from amorphous $SiO_2$ particles (silica glass) by conventional shaping steps. Also in the context of the present invention, a silica glass crucible is intended to mean a shaped body with a crucible shape produced by sintering and/or melting a silica glass green body.

Silica glass green bodies suitable as starting materials for the method according to the invention are known. They are described, for example, in the U.S. Pat. No. 5,053,359 or German published application DE-A-19943103. The silica glass green body is, for example as described in DE-A-19943103, fully or partially supplemented with a compound that promotes or causes crystallization of $SiO_2$, preferably formation of cristobalite. All compounds known to one skilled in the art are suitable. Non-limiting examples include the compounds described in EP 0753605, U.S. Pat. No. 5,053,359 and GB 1428788. It is to be expected that further suitable compounds will be discovered in the future.

A "crystallization inducing" compound is preferably selected from among barium, aluminum and boron compounds, and mixtures thereof. $Ba(OH)_2$, barium oxide, barium carbonate or aluminum oxide are particularly preferred. $Ba(OH)_2$, barium oxide or barium carbonate are more particularly preferred.

The crystallization-inducing compound may be added to the starting material for the production of the silica glass green body before and/or after the crucible shaping. This may be done using methods known in the prior art. If the addition is to take place after the crucible shaping, addition generally involves application to and/or penetration into the surface of the silica glass green body. This may be done both before drying and after drying the silica glass green body.

The addition of the crystallization-inducing compound may take place in a liquid and/or a solid form. If the compounds are added in liquid form, solutions thereof are generally used. All solvents in which the respective substance dissolves at a sufficient concentration are in principle suitable as solvents in this case. Water is the preferred solvent. The concentration of the crystallization-inducing compounds in the solution is preferably between 0.001 and 100% by weight, more preferably between 0.001 and 10% by weight, and most preferably between 0.001 and 1% by weight.

The solutions may be applied one or more times in a controlled manner, for example by spraying, immersion or impregnation. Since open-pored silica glass green bodies are involved, the solution in this case penetrates with the aid of capillary forces into the pores in the silica glass green body, where it preferably wets the surface of pores. Single or repeated controlled electrophoretic deposition of the crystallization-inducing substances dissolved in solvent into the pores of the silica glass green body is also possible.

The silica glass green body is subsequently dried. Optionally, it may also be dried between the individual application steps. Drying is generally performed at temperatures between room temperature and the boiling point of the solvent that is used. In the case of water as the solvent, drying preferably takes place between 40° C. and 100° C., more preferably between 70° C. and 95° C. Optionally, drying may also be performed under vacuum.

In the manner described above, it is possible to create one or more regions, or layers, in the silica glass green body in which the surface is fully or partially covered with the crystallization-inducing compounds. The concentration of the crystallization-inducing compounds in the pore surfaces may furthermore be adjusted as desired.

In particular, it is possible to create a crucible wall having a crystallization-inducing compound-containing inner and/or outer layer with a respectively desired thickness, or a crystallization-inducing compound-containing layer lying fully in the interior of the crucible wall, or a silica glass green body fully permeated with the crystallization-inducing compounds.

If the compounds are used in the solid form, then they are preferably added directly to the $SiO_2$-containing dispersion from which a crucible-shaped silica glass green body will be formed. The compounds may be used in all particle sizes and shapes, although it is preferable to employ particles of the order of magnitude of the $SiO_2$ particles employed for the dispersion. Preferably, all particles in the dispersion are distributed as homogeneously as possible. The production of the dispersion as well as the addition and distribution of the particulate compounds to and within the dispersion follows conventional methods known to those skilled in the art. The production of the shaped body from such dispersions likewise follows customary methods known to the skilled artisan, for example as disclosed in DE 19943103.

In contrast to addition of crystallization-inducing compounds in liquid form, crystallization-inducing compounds added in solid form are distributed not only on the surface of the pores of the dried silica glass green body, but also between the $SiO_2$ particles that form the crucible. Electrophoretic deposition of the compound particles into the pores of a silica glass green body is also possible.

Preferably from 0.01 to 1000 µg of crystallization-inducing compound per g of $SiO_2$, more preferably from 0.01 to 500 µg per g of $SiO_2$, and most preferably from 0.01 to 100 µg per g of $SiO_2$, are introduced into the silica glass green body.

As described in U.S. Pat. No. 4,018,615, it is also possible to induce crystallization by adding crystalline $SiO_2$ particles to the dispersion and/or to the porous silica glass green body. The crystalline $SiO_2$ particles preferably have the same particle sizes as the amorphous particles that form the silica glass green body.

A crystallization-inducing compound-containing silica glass green body is then preferably subjected to a heat treatment (partial sintering), preferably at temperatures between 500° C. and 1300° C., more preferably between 800° C. and 1100° C. Duration of sintering is preferably from 1 to 180 min., more preferably from 1 to 60 min. During this process, the grain boundaries merge with one another, so-called grain necks being formed, which leads to increased mechanical stability of the silica glass green body. During this heat treatment, however, an open porosity of the silica glass green body must be preserved.

A silica glass green body produced in this manner is then filled with one or more metals or semimetals. The metals or semimetals are in this case preferably present in the form of lumps and/or granules and/or powder. In principle, it is possible to use all known metals or semimetals, or mixtures thereof. Preferably, however, poly- and/or monocrystalline silicon, more preferably high-purity poly- or monocrystalline silicon, or mixtures thereof, are used.

The silica glass green body filled with a metal or semimetal is heated, preferably over a period of from 10 to 1500 minutes, until a temperature of between 1000 and 1600° C., more preferably between 1300 and 1500° C., prevails in the metal melt. The heating leads, before, during and after melting of the metal, to crystallization in the regions in the silica glass crucible which are supplemented with substances that promote crystallization. Cristobalite structures are preferably created during the crystallization.

The concentration of crystalline $SiO_2$ can advantageously be controlled though the nature and concentration of the substances that promote crystallization, as well as through the temperature and the duration of the heating. Through suitable selection of the melt conditions for the polycrystalline silicon, it is possible to influence the sintering and crystallization behavior of the silica glass crucible. For a silica glass green body produced using the especially preferred concentration of the compound that promotes crystallization, i.e. from 0.01 to 100 µg of compound per g of $SiO_2$, it is particularly preferred to heat a silica glass green body over a period of from 40 to 800 minutes, reaching a temperature of 1300° C. Under these conditions, a closed and fully crystalized surface of the inside of the crucible is created before liquid metal or semimetal, preferably silicon, comes into contact with the crucible wall. Subsequently, the temperature is increased within from 20 to 700 minutes to the temperature level required for pulling a single crystal, for example to the range of from 1300° C. to 1500° C.

After the melting of the metal or semimetal, preferably polycrystalline silicon, a single crystal can be pulled by employing parameters known from the prior art.

Surprisingly, it has been found that the oxygen level in a crystal that has been pulled from a silica glass crucible produced using the method of the invention is higher than in a crystal that has been pulled from a conventional quartz crucible. The density of oxygen precipitates in the single crystal after standard heat treatment (4 h 780° C., 16 h 1000° C.), however, is significantly lower than in crystals from conventional quartz crucibles. Presumably, the thick crystalline layer formed in the method according to the invention acts as a diffusion barrier for impurities that would otherwise enter the Si single crystal via the Si melt, and there act as seeds for the oxygen precipitates.

The process of the invention therefore makes it possible in a concerted process to produce a crucible with controlled levels of crystallization, followed by pulling a single crystal, preferably an Si single crystal pulled by means of a CZ method. The invention thus also pertains to a method for pulling a single crystal from a melt of a metal or semimetal in a crucible, wherein a silica glass green body, which has been infiltrated with a substance that promotes crystallization, preferably cristobalite formation, is used as the crucible. The invention further pertains to the use of a silica glass green body, which is infiltrated with a substance that promotes cristobalite formation, for pulling a single crystal, preferably an Si single crystal.

A thick crystalline crucible inner layer formed in the method of the invention offers the following advantages for simultaneously performed single-crystal pulling: The growth rate of gas bubbles, which are present in the starting material, is significantly reduced in the crystalline region because of the higher viscosity of crystalline quartz compared with amorphous quartz glass. The likelihood of the emission of quartz particles into the Si melt is significantly reduced by creating a crystalline inner layer that is more than 1 mm thick. This has a positive effect on dislocation-free crystal yield. Reduction in the emission of quartz particles into the melt is due to the slower growth rate of the gas bubbles and the reduced mechanical stress at the inner surface of the crucible. The mechanical stress is reduced, compared with known quartz glass crucibles with a thin crystalline inner layer, since the transition from the crystalline structure to the amorphous structure is shifted into the interior of the crucible wall.

Figure 3:
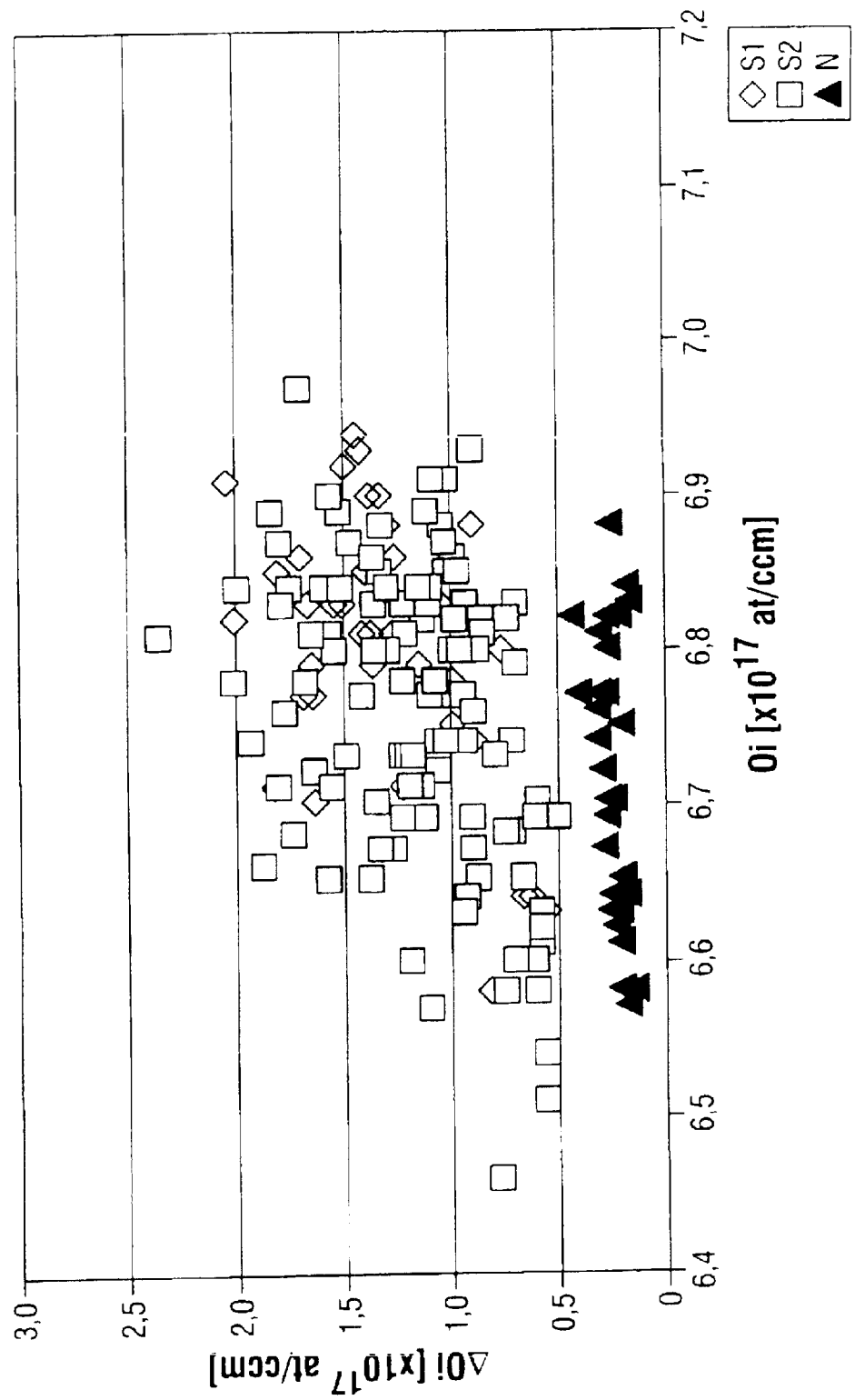
FIG. 3 shows a comparison of the Oi precipitation of crystals, which were produced by using standard quartz crucibles S1 and S2, with a crucible N produced according to the invention by using Example 2.

Owing to the lower mobility of impurity atoms in crystalline quartz compared with amorphous quartz, crystalline layers can be used as a diffusion barrier to protect the Si melt against impurities. The action of a crystalline surface layer as a diffusion barrier is shown by the reduced oxygen precipitation level in the single crystal (FIG. 3). The reduced impurity level of the Si melt when employing such crucibles leads to a smaller number of seeds at which oxygen precipitates can form in the single crystal during the cooling phase.

The crystalline outer layer formed in the inventive method offers the several advantages for simultaneously performed single-crystal pulling. First, a crystalline outer layer that is preferably at least 2 mm thick increases the mechanical stability of the crucible. Second, the thickness of the crystalline layer can be selected such that the crucible, although sintered in the melting phase of the CZ method, does not experience any change in its geometrical dimensions.

A crystalline layer formed in the inventive method and situated in the interior of the crucible wall, also provides several advantages for simultaneously performed single-crystal pulling. For example, a crystalline layer situated in the interior of the silica glass crucible constitutes an effective diffusion barrier for impurity elements at the high temperatures prevailing in the pulling method (for example the CZ method), and it provides the opportunity to separate regions of the crucible that are manufactured using high-purity materials from those with lesser material quality. The production costs for crucibles, in which the materials that enter into contact with liquid metal (for example Si) must meet the most stringent purity requirements, can thereby be reduced significantly.

A particular advantage when pulling single crystals is obtained by a silica glass crucible that is fully transformed into crystalline quartz during the heating phase of the CZ method. To that end, the silica glass green body, permeated homogeneously with the crystallization-inducing compound, is heated in the filled state to a temperature of 1300° C. within from 50 to 1500 minutes. Next, the temperature is increased to the temperature level required for pulling a single crystal, preferably to the range of from 1300° C. to 1500° C. Owing to the higher mechanical stability of such a crucible, the wall thickness can be reduced. The crucibles can therefore be manufactured less expensively. Increasing the stability of quartz glass crucibles by doping, for example with aluminum oxides, known from the literature, may be avoided, as fully crystalized crucibles have a significantly lower impurity level for equal stability.

Furthermore, the mobility of the impurities that are present is significantly reduced by the lower diffusion constant in crystalline $SiO_2$ as compared with amorphous $SiO_2$, which reduces the impurity level of the Si melt, and therefore also of the Si single crystal that is pulled. The higher viscosity of crystalline $SiO_2$ also entails a reduction in the growth rate of gas bubbles that have been included in the material during the production process. This lowers the risk that displaced bubbles may emit quartz particles into the Si melt. A fully crystalline crucible furthermore exhibits no corrosion phenomena on the inside of the crucible during contact with liquid Si. Mechanical stresses between crystalline and amorphous regions are furthermore avoided owing to the homogeneous material properties. Nevertheless, the opportunity to employ starting materials of different purity for the inner layer and the outer layer of the silica glass crucible still exists.

Depending on the concentration of the substance that causes crystallization, the structure of the crucible surface can be varied from closed and pore-free, preferably with a concentration of from 0.01 to 100 μg of compound per g of $SiO_2$, to a very open-pored structure, preferably with a concentration of from 100 to 1000 μg of compound per g of $SiO_2$. The open-pored structure has a significantly larger surface area wetted with Si compared with the closed structure. This leads to an increase in the delivery of oxygen to the Si melt, and constitutes a suitable way of increasing the oxygen concentration of a crystal.

EXAMPLE 1

Production of a Silica Glass Green Body

High-purity fumed and fused silica were dispersed homogeneously, without bubbles and without metal contamination, in double-distilled H₂O under vacuum with the aid of a plastic-coated mixer. The dispersion produced in this way had a solids content of 83.96% by weight (95% fused and 5% fumed silica). The dispersion was shaped into a 14" crucible in a plastic-coated outer mold by means of the so-called roller method which enjoys widespread in the ceramic industry. After 1 hour of partial drying at a temperature of 80° C., the crucible could be released from the mold and dried to completion within 24 hours at about 200° C. The dried open-pored silica glass green body had a density of approximately 1.62 g/cm³ and a wall thickness of 9 mm.

The silica glass green body was uniformly sprayed on the inside and on the outside with 40 g of a 0.2% by weight strength aqueous BaOH solution. In this case, an inner layer and an outer layer each with a layer thickness of 3 mm were infiltrated with barium hydroxide. The barium concentration in these layers was in this case 46 μg per gram of SiO₂. The crucible was dried for 4 hours at 200° C.

EXAMPLE 2

Production of Crystalline Silica and Simultaneous Pulling of a Single Crystal The silica glass green body with a diameter of 14" from Example 1 was placed in a graphite support crucible customary for the CZ pulling of Si single crystals, and was filled with 28 kg of polycrystalline silicon. The normally supplied electrical power for melting the silicon was modified so that a temperature of 1300° C. was reached within 80 minutes in the radial region of the silica glass green body. Under these conditions, transformation of the porous silica glass into cristobalite took place before liquid Si came into contact with the wall of the silica glass crucible. The melting time is increased by 20% compared with the standard method.

After melting of the silicon, a seed crystal is immersed in the melt, and the crystal growth thereon begins. The crystal pulling process takes place using conventional methodology, by producing a thin neck to eliminate undesired dislocations, subsequently increasing the diameter in the shoulder or cone region to the desired target diameter and continuing to produce a cylindrical single crystal. In order to be able to separate the crystal from the melt without dislocation, an end cone is pulled at the end of the cylindrical part by reducing the diameter of the crystal to zero over a predetermined length. In the present example, the diameter in the cylindrical region of the single crystal was 129 mm. Both an inner and an outer 100% crystalline layer of cristobalite were created in the crucible walls during the pulling process (FIG. 1).

EXAMPLE 3

Study of the Proportion of Amorphous and Crystalline Phases in the Silica Glass Crucible The dependency of the proportion of amorphous and crystalline phases in the silica glass crucible, as a function of temperature and time, was studied using a crucible that was produced according to Example 1 in the presence of 32 μg of barium per g of SiO₂. The result is given in Tab. 1:

| Temperature [° C.] | Time [h] | Crystalline Proportion (cristobal) [% by weight] |
|---|---|---|
| 200 | 1 | 0 |
| 200 | 10 | 0 |
| 1000 | 0.5 | <0.1 |
| 1000 | 2 | 0.5 |
| 1000 | 10 | 3.5 |
| 1200 | 2 | 10 |
| 1200 | 10 | 50 |
| 1500 | 2 | 100 |

EXAMPLE 4

Determination of the Properties of Crystals which were Produced Using Conventional Quartz Crucibles, and of a Crystal which was Produced by Means of the Silica Glass Crucible Produced According to the Invention From the crystal produced in accordance with subject invention Example 2, test wafers were taken from a plurality of positions along the axis of the cylindrical region, in order to determine the interstitial oxygen content (Oi) of the crystal by means of FTIR (Fourier Transformation Infrared Spectroscopy) according to the ASTM standard. Measurement results of single crystals, for whose production amorphous quartz glass crucibles were employed, are used as a comparison basis. The process parameters during the growth of the crystal were identical from the thin neck to the end cone for the crystal according to the process of subject invention Example 2 and the single crystals of the comparison group.

Figure 2:
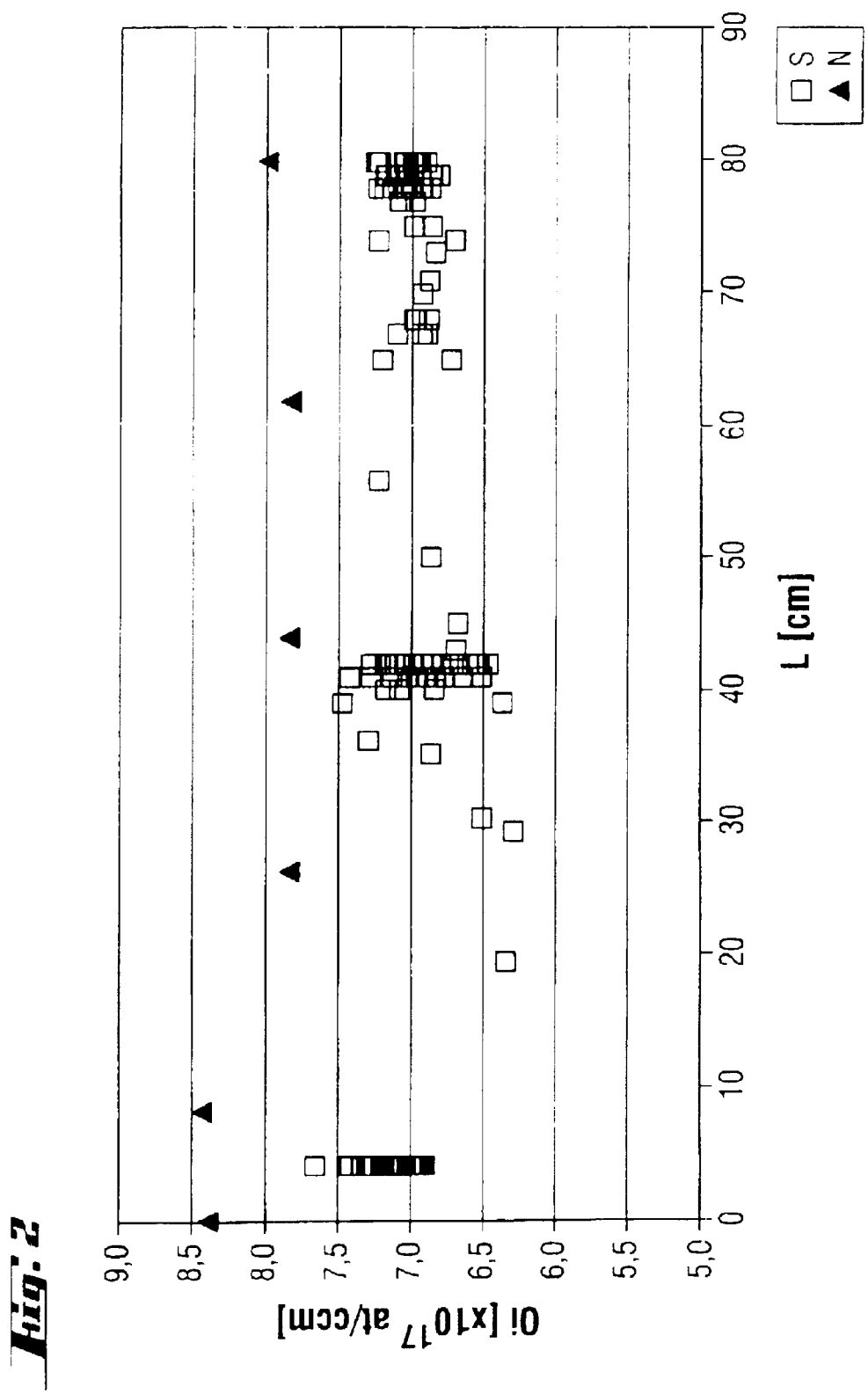
FIG. 2 shows a comparison of the Oi content in relation to the crystal length L of crystallites, which were produced by using standard quartz crucibles (S), and a crucible produced according to the invention by using Example 2 (N).

The interstitial oxygen content (Oi content) of the crucible produced according to the invention was $1.10^{17}$ at/cm³ higher than the Oi content of a conventional quartz crucible (see FIG. 2). The density of oxygen precipitates after standard heat treatment, however, was significantly lower than in the case of conventional quartz crucibles (see FIG. 3).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for the production of a silica glass crucible, comprising
   a) providing a porous amorphous silica glass green body;
   b) infiltrating at least one surface or a portion thereof of said porous amorphous silica glass green body with at least one substance which promotes crystallization of silica to form an infiltrated green body;
   c) drying the infiltrated silica glass green body to form a dried infiltrated green body;
   d) filling the dried infiltrated silica glass green body with a metal or semimetal, and
   e) heating the filled, infiltrated silica glass green body over a period of from 1 h to 1000 h at a temperature of from 900° C. to 2000° C.

2. The method of claim 1, wherein the silica glass green body is subjected between method step c) and method step d) to a heat treatment, in which grain neck formation takes place but an open porosity of the silica glass green body is preserved.

3. The method of claim 1 wherein said temperature in the range of 900° C. to 2000° C. is reached over a period of from 10 minutes to 1500 minutes.

4. The method of claim 1, wherein a substance that promotes crystallization of silica is at least one barium, aluminum or boron compound, or mixture thereof.

5. The method of claim 4, wherein said barium or aluminum compound comprises one or more of $Ba(OH)_2$, barium oxide, barium carbonate or aluminum oxide.

6. The method of claim 4, wherein the at least one compound or mixture thereof is applied in liquid form to a porous amorphous silica glass green body by spraying, immersion or impregnation.

7. The method of claim 4, wherein the at least one compound or mixture thereof is used in solid form and is added to a dispersion containing $SiO_2$, from which the silica glass green body is formed.

8. The method of claim 1 wherein one or more substances which promote crystallization of silica are supplied in solid form in admixture with a silica dispersion used to prepare a porous amorphous silica glass green body, and the green body therefrom prepared is further treated with one or more substances which promote crystallization of silica in liquid form.

9. The method of claim 6, wherein the compound is applied in an amount of from 0.01 to 1000 $\mu g/g$ of $SiO_2$.

10. The method of claim 1, wherein the metal or semimetal is selected from the group of polycrystalline silicon, monocrystalline silicon, and mixtures thereof.

11. The method of claim 10, wherein said polycrystalline silicon is high purity polycrystalline silicon and said monocrystalline silicon is high purity monocrystalline silicon.

12. The method of claim 1, further comprising melting said metal or semi-metal to form a melt and pulling a single crystal from the melt.

13. A method for pulling a single crystal from a melt of a metal or semimetal or mixture thereof in a crucible, said method comprising pulling said single crystal from a melt contained in an unsintered or partially sintered porous amorphous silica glass crucible green body infiltrated with a substance that promotes crystallization of silica.

14. The method of claim 13, wherein the substance that promotes crystallization of silica promotes cristobalite formation.

15. The method of claim 13, wherein the single crystal is an Si crystal.

16. The method of claim 13 where a crystalline surface having a thickness of about 2 mm or more is formed on an inner surface of said crucible.

17. The method of claim 16 where a surface of crystalline silica is also formed on an outer surface of said crucible, said crystalline surface on said outer surface of said crucible and said crystalline surface on said inner surface of said crucible defining a space therebetween comprising substantially amorphous silica.

18. A method for the pulling of single crystal silicon by the CZ process, said process comprising
   a) providing a dispersion of silica and preparing from said dispersion a porous, amorphous silica glass crucible green body, said dispersion optionally containing, in addition to a solid silica particle phase, a solid phase of particles of one or more compounds which promote crystallization of silica;
   b) drying said porous, amorphous silica glass crucible green body, and optionally sintering said porous, amorphous silica glass crucible green body to induce grain neck formation between and among silica particles while preserving porosity of the porous, amorphous silica glass crucible green body, to produce a dried crucible green body;
   c) infiltrating at least one surface or a portion thereof of said porous, amorphous silica glass crucible green body and/or said dried crucible green body with a solution or dispersion of one or more compounds which promote crystallization of silica;
   d) adding monocrystalline silicon, polycrystalline silicon, or a mixture thereof to said dried crucible green body to form a silicon-containing crucible green body;
   e) heating said silicon-containing dried crucible green body to a temperature less than the melting point of silicon over a time period sufficient to induce crystallization of amorphous silica to crystalline silica to form a silicon-containing crucible having at least an inner surface comprising crystalline silica;
   f) further heating said silicon-containing crucible having at least an inner surface comprising crystalline silica to melt said silicon to form a silicon melt; and
   g) introducing a seed crystal of silicon into the melt, and pulling a single crystal silicon ingot from the melt.

19. The process of claim 18, wherein amorphous silica still contained within walls of said crucible crystallizes to crystalline silica during pulling of the single crystal silicon ingot.

20. The process of claim 18, wherein said single crystal silicon ingot contains fewer oxygen precipitates than a single crystal silicon ingot prepared similarly but using a crucible not prepared in accordance with steps a) through e).

* * * * *